United States Patent
von Campenhausen et al.

(10) Patent No.: US 7,181,579 B2
(45) Date of Patent: Feb. 20, 2007

(54) INTEGRATED MEMORY HAVING REDUNDANT UNITS OF MEMORY CELLS AND METHOD FOR TESTING AN INTEGRATED MEMORY

(75) Inventors: Aurel von Campenhausen, München (DE); Manfred Pröll, Dorfen (DE); Jörg Kliewer, München (DE); Stephan Schröder, München (DE)

(73) Assignee: Infineon Technologies AG, Munich (DE)

( * ) Notice: Subject to any disclaimer, the term of this patent is extended or adjusted under 35 U.S.C. 154(b) by 336 days.

(21) Appl. No.: 10/798,334

(22) Filed: Mar. 12, 2004

(65) Prior Publication Data

US 2004/0205308 A1  Oct. 14, 2004

(30) Foreign Application Priority Data

Mar. 14, 2003  (DE) ............................... 103 11 373

(51) Int. Cl.
  *G06F 12/16* (2006.01)
  *G11C 11/413* (2006.01)
(52) U.S. Cl. ....................... 711/154; 365/200
(58) Field of Classification Search ...................... None
  See application file for complete search history.

(56) References Cited

U.S. PATENT DOCUMENTS 5,732,029 A * 3/1998 Lee et al. ................... 365/200
5,808,948 A * 9/1998 Kim et al. ................... 365/201
5,848,003 A * 12/1998 Nishikawa ................... 365/200
6,349,064 B1 * 2/2002 Nakaoka ..................... 365/200
6,618,306 B2  9/2003 Böhm et al.

OTHER PUBLICATIONS

The Authoritative Dictionary of IEEE Standards Terms, Dec. 2000, IEEE Press, 7th Edition, p. 949.*

* cited by examiner

*Primary Examiner*—Donald Sparks
*Assistant Examiner*—James Golden
(74) *Attorney, Agent, or Firm*—Edell, Shapiro & Finnan, LLC

(57) ABSTRACT

An integrated memory has individually addressable normal and redundant units of memory cells. A memory unit is used to store, in a normal mode, an address for one of the normal units which needs to be replaced by one of the redundant units. A comparison unit compares an address which is present on an address bus with an address stored in the memory unit and activates one of the redundant units in the event of a match being identified. The memory also has a test circuit which can be activated by a test mode signal, can reset the memory unit to an initial state, and can store an address for one of the redundant units in the memory unit for subsequently writing an identification code to this redundant unit.

7 Claims, 1 Drawing Sheet

INTEGRATED MEMORY HAVING REDUNDANT UNITS OF MEMORY CELLS AND METHOD FOR TESTING AN INTEGRATED MEMORY

CROSS REFERENCE TO RELATED APPLICATIONS

This application claims priority under 35 USC §119 to German Application No. 10311373.8, filed on Mar. 14, 2003, and titled "Integrated Memory Having Redundant Units of Memory Cells and Method for Testing an Integrated Memory," the entire contents of which are hereby incorporated by reference.

FIELD OF THE INVENTION

The present invention relates to an integrated memory having memory cells in a memory cell array, and more particularly, to an integrated memory having memory cells combined to form individually addressable normal units and redundant units of memory cells for respectively replacing one of the normal units on an address basis. The invention also relates to a method for testing an integrated memory of this type.

BACKGROUND

For the purpose of repairing faulty memory cells, integrated memories generally have redundant units of memory cells which can replace normal units of memory cells containing faulty memory cells on an address basis. The redundant units of memory cells are, for example, in the form of redundant word lines or redundant bit lines which can replace normal word lines or normal bit lines. In this context, the integrated memory is tested using an external testing device or a self-test device, for example, and the redundant elements are then programmed. A redundancy circuit has programmable elements, for example, in the form of laser fuses or electrically programmable fuses, which are used to store the address of a unit which needs to be replaced. These programmable elements are programmed by means of a laser beam or by a "burning voltage", for example, in the course of the memory's production process.

During operation of a memory of this type, faulty normal units, which need to be replaced, are replaced on an address basis by appropriate redundant units in the course of a memory access operation. Before a memory access operation, a redundancy evaluation is made in the redundancy circuits within a selected memory area. This is done by applying an address for the selected normal unit to an address bus and then comparing the applied address with an address for a faulty normal unit, which is stored in the respective redundancy circuit. If there is a match, the appropriate redundancy circuit activates the associated redundant unit instead of the faulty normal unit.

Integrated memories are generally subject to extensive function tests in the production process. These function tests are used, inter alia, to identify faulty memory cells or faulty word lines or bit lines. Function tests are also carried out on memories which have already been used in the application and in which faults have been found during operation of the memory. In such cases, it is desirable to carry out fault analysis in order to be able to gain further knowledge of physical relationships and failure probabilities.

One cause of varying fault behavior resides, for example, in the fact that the "data background" of certain memory cells differs depending on the memory. Faulty memory cells may, in particular, be physically adjacent to redundant units. In this case, a factor influencing the fault behavior of the memory cells in the immediate vicinity of redundant elements is whether one or more of the adjacent redundant elements are being used, i.e., have been programmed for a replacement operation for normal units (and thus have been topologically defined). Information of this type has hitherto not been available when analyzing a closed memory chip which has already been used in the application, since the original fault analysis data which was obtained by function tests in the production process is no longer available. In order, nevertheless, to make it possible to analyze the topology sensitivity of a fault mechanism, complicated preparation involving opening of the memory chip package is necessary. Preparation of this type entails the risk of the chip possibly being destroyed and as a result no longer being available for further analysis.

SUMMARY

Providing an integrated memory in which it is possible to analyze the topology sensitivity of a fault mechanism in a function test without the chip having to be prepared and opened for this purpose is desirable.

A method (which is suitable for this purpose) for testing such a memory is also desirable.

An integrated memory in accordance with the invention can include, in addition to normal and redundant units of memory cells, a memory unit for storing, in a normal mode, an address for one of the normal units which needs to be replaced by one of the redundant units. The integrated memory can also include a comparison unit which is connected to an address bus in the memory and to an output of the memory unit. The comparison unit can compare an address which is present on the address bus with an address stored in the memory unit. In the event of a match being identified, it can activate an appropriate redundant unit. The memory in accordance with the invention also has a test circuit which can be activated by a test mode signal and can be used to reset the memory unit to an initial state and to store an address for one of the redundant units in the memory unit for the purpose of subsequently writing to this redundant unit.

In a test method for the purpose of analyzing the topology sensitivity of a fault mechanism, first a test mode can be activated by activating the test mode signal. The memory unit can be reset to an initial state by the test circuit. An address for one of the redundant units can subsequently be stored in the memory unit and an identification code can be written to this redundant unit. The test mode can then be deactivated and the memory unit can be set using the "postfuse" information, i.e., using the address for one of the normal units which needs to be replaced. The memory cell array can then be accessed by applying addresses for normal units to the address bus so that the memory cell array can be read. Reading the memory cell array can involve a replacement operation being executed upon application of the address for that normal unit, which needs to be replaced by the redundant unit to which the identification code has previously been written.

The identification code, which is read in the process, can be associated with the address for the normal unit addressed for this purpose, which has been replaced by the redundant unit to which the identification code was written. Now it is possible to analyze which normal unit is replaced by which redundant unit, i.e., which redundant unit is associated with which normal unit. Thus, the topology sensitivity of a fault mechanism can be analyzed without requiring complicated preparation involving opening of the chip package.

BRIEF DESCRIPTION OF THE DRAWINGS

The invention is explained in more detail below with reference to FIGS. 1A and 1B, which illustrate an exemplary embodiment of the present invention.

DETAILED DESCRIPTION

Figure 1A:
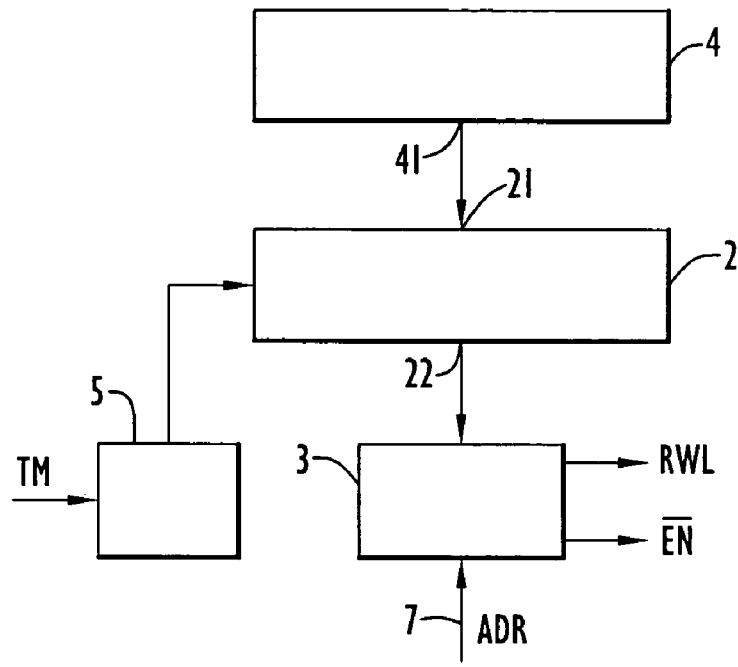
Figure 1B:
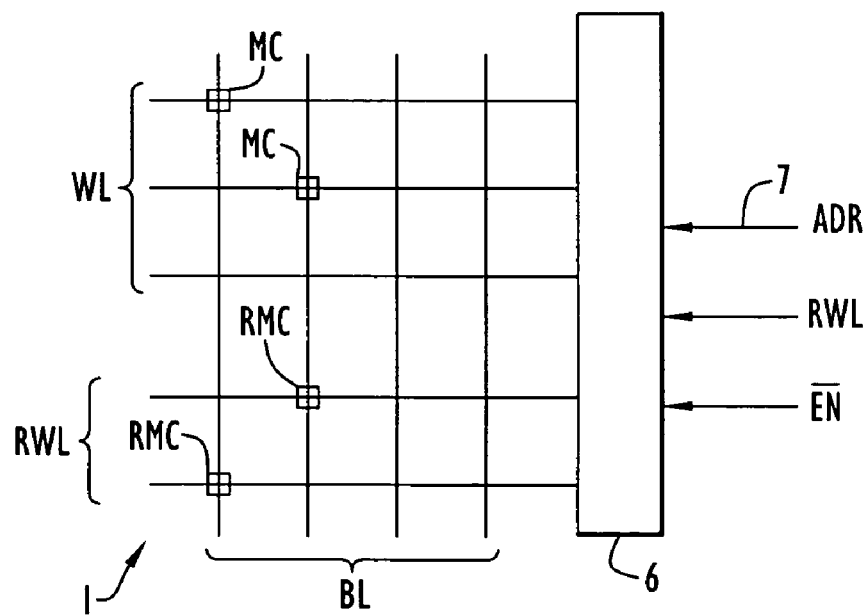

FIGS. 1A and 1B show one exemplary embodiment of an inventive integrated memory which has memory cells MC, RMC in a memory cell array 1 having word lines WL, redundant word lines RWL and bit lines BL. The memory cells MC can be arranged at crossover points between the bit lines BL and word lines WL. The redundant memory cells RMC can be arranged at crossover points between the bit lines BL and redundant word lines RWL. To assist understanding, FIGS. 1A and 1B are used to explain the invention only with regard to a few redundant word lines RWL. In practice, an integrated memory generally can include a plurality of redundant lines. The invention may also be applied to redundant bit lines or redundant memory blocks in the memory. The invention relates to any desired types of integrated memories in which redundant addressable units with memory cells are used to replace normal addressed units of memory cells.

The exemplary embodiment shown in FIGS. 1A and 1B is a DRAM. The memory cells MC, RMC of the DRAM each can include a selection transistor and a storage capacitor. In this case, control inputs of the selection transistors can be connected to one of the word lines WL, RWL, while a main current path in the selection transistors can be arranged between the storage capacitor in the respective memory cell MC, RMC and one of the bit lines BL.

The memory can also have a programmable memory unit 2 for storing an address for a word line WL which needs to be replaced. The memory unit 2 can be, for example, a register having register elements for storing a respective address bit. There can also be a second nonvolatile memory unit 4, which can be programmed once and can have laser fuses which can be programmed, for example, from outside the memory by means of a laser beam. The memory unit 4 can be used to permanently store an address for a word line WL which needs to be replaced, and can have an output 41 which is connected to a corresponding input 21 of the memory unit 2 for the purpose of transmitting an address stored in the memory unit 4 to the memory unit 2.

There can also be a comparison unit 3, which can be connected to an address bus 7 in the memory and to an output 22 of the memory unit 2. The comparison unit 3 can compare the address stored in the memory unit 2 with the current address ADR present on the address bus 7. If the current address is found to match the address stored in the memory unit 2, the comparison unit 3 can activate one of the redundant word lines RWL and can use a deactivation signal /EN to deactivate a word line WL, which is addressed by the current address ADR. A word line decoder 6 can be connected to the address bus 7 and, in the active state, can activate one of the word lines WL, RWL, which is associated with the corresponding address. If, however, a redundant word line RWL has been addressed, it is necessary to prevent activation of a normal word line WL, which needs to be replaced. This can be ensured by the comparison unit 3 by the deactivation signal /EN.

The address stored in the nonvolatile memory unit 4 can be loaded into the programmable memory unit 2, for example, when the memory chip is "powered up". The address stored in the memory unit 2 then represents the position of the normal word line WL which needs to be replaced, and not the position of the associated redundant word line RWL. Direct association (which can be detected from outside) between the word line WL, which needs to be replaced and the associated redundant word line RWL is not possible.

The memory can also have a test circuit 5, which can be activated by a test mode signal TM and can make it possible to reset the memory unit 2 to an initial state ("prefuse settings"). When resetting the memory unit 2, an address for one of the redundant word lines RWL can be stored in the memory unit 2 for the purpose of subsequently writing to this redundant word line. For example, the address 105 for a redundant word line RWL can be stored in the memory unit 2. This redundant word line can then be accessed, and an identification code, for example, the value 105, can be written to the redundant word line. In this case, the address stored in the memory unit 2 represents the position of the redundant word line. The test mode signal TM and thus the corresponding test mode can then be deactivated.

As was previously the case when the memory was powered up, the memory unit 2 can then be set using the address for a normal word line WL, which needs to be replaced (postfuse setting). The memory cell array 1 can subsequently be accessed, and the addresses for the normal word lines WL can be successively applied in order to read the memory cell array 1. The memory unit 2 can, for example, be set using the address 25 for a normal word line WL which needs to be replaced. If, when the memory cell array 1 is being read, the word line WL having the address 25 is accessed, it can be replaced on an address basis by the redundant word line RWL having the address 105. To this end, the comparison unit 3 can ascertain that the address 25 present on the address bus 7 matches the address stored in the memory unit 2, whereupon the redundant word line RWL having the address 105 can be activated. In this case, the identification code 105 stored therein can be read and may be associated with the address 25 for the normal word line WL addressed via the address bus 7. This results in the redundant word line RWL with the address 105 being associated with the normal word line WL having the address 25.

The invention thus makes it possible to ascertain which redundant element is associated with which normal element which needs to be replaced. This means that it is also possible to analyze the topology sensitivity of a fault mechanism at a later stage in which test results of function tests in the course of a memory's production process are no longer available. To this end, it is possible to dispense with complicated preparation involving opening of the chip package.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Memory cell array
2 Memory unit
3 Comparison unit

4 Memory unit
5 Test circuit
6 Word line decoder
7 Address bus
21 Input
22 Output
41 Output
WL Word lines
RWL Redundant word lines
BL Bit lines
MC Memory cells
RMC Redundant memory cells
ADR Address
/EN Deactivation signal
TM Test mode signal

We claim:

1. An integrated memory, comprising:
   a plurality of memory cells in a memory cell array, the memory cells being combined to form individually addressable normal units;
   a plurality of redundant units of memory cells for respectively replacing one of the normal units on an address basis;
   a memory unit for storing, in a normal mode, an address for one of the normal units which needs to be replaced by one of the redundant units;
   a comparison unit connected to an address bus in the memory and to an output of the memory unit, the comparison unit comparing an address which is present on the address bus with an address stored in the memory unit and activating one of the redundant units in the event of a match being identified; and
   a test circuit activated by a test mode signal and operable to reset the memory unit to an initial state and to store an identification code for one of the redundant units in the memory unit for subsequently writing the identification code to the one of the redundant units, wherein the identification code represents a position of the one of the redundant units in the memory cell array, and each of the redundant units is discriminated by a respective identification code.

2. The integrated memory as claimed in claim 1, wherein the memory unit is programmable, and the memory includes a second nonvolatile memory unit for permanently storing an address and at least one output which is connected to a corresponding input of the memory unit for transmitting an address stored in the second memory unit to the programmable memory unit.

3. The integrated memory as claimed in claim 2, wherein the second nonvolatile memory unit can be programmed only once.

4. The integrated memory as claimed in claim 2, wherein the second nonvolatile memory unit has laser fuses, which can be programmed from outside the memory by a laser beam.

5. The integrated memory as claimed in claim 1, wherein the memory is in the form of a DRAM.

6. The integrated memory as claimed in claim 1, wherein the memory unit is in the form of a register having register elements for storing a respective address bit.

7. A method for testing an integrated memory including a plurality of memory cells in a memory cell array, the memory cells being combined to form individually addressable normal units, a plurality of redundant units of memory cells for respectively replacing one of the normal units on an address basis, a memory unit for storing, in a normal mode, an address for one of the normal units which needs to be replaced by one of the redundant units, a comparison unit which is connected to an address bus in the memory and to an output of the memory unit for comparing an address which is present on the address bus with an address stored in the memory unit and for activating one of the redundant units in the event of a match being identified, the method comprising:
   activating a test mode;
   resetting the memory unit to an initial state;
   storing an identification code for one of the redundant units in the memory unit, wherein the identification code represents a position of the one of the redundant units in the memory cell array, and each of the redundant units is discriminated by a respective identification code;
   writing the identification code to the one of the redundant units;
   deactivating the test mode;
   setting the memory unit using the address for one of the normal units which needs to be replaced;
   accessing the memory cell array;
   applying addresses for normal units to the address bus for reading the memory cell array;
   reading the memory cell array; and
   associating the identification code which is read with the address for the normal unit addressed for this reading operation.

* * * * *